(12) United States Patent
Mizumura et al.

(10) Patent No.: US 7,378,780 B2
(45) Date of Patent: May 27, 2008

(54) SURFACE MOUNT TYPE CRYSTAL OSCILLATOR

(75) Inventors: Hiroaki Mizumura, Sayama (JP); Kouichi Moriya, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 65 days.

(21) Appl. No.: 11/594,739

(22) Filed: Nov. 9, 2006

(65) Prior Publication Data
US 2008/0012451 A1    Jan. 17, 2008

(30) Foreign Application Priority Data
Nov. 9, 2005 (JP) ............... 2005-324317
Nov. 18, 2005 (JP) ............... 2005-334670

(51) Int. Cl.
*H01L 41/053* (2006.01)

(52) U.S. Cl. .............. 310/341; 310/343; 310/344; 310/346; 310/348; 331/68; 331/108 D; 331/158

(58) Field of Classification Search ............... 310/341, 310/343, 344, 346, 348, 349; 331/108 D, 331/68, 158
See application file for complete search history.

(56) References Cited

U.S. PATENT DOCUMENTS 5,962,950 A * 10/1999 Egara et al. ............ 310/313 R
6,229,249 B1 * 5/2001 Hatanaka et al. ............ 310/348
6,734,605 B2 * 5/2004 Kinoshita ............ 310/348
6,833,651 B2 * 12/2004 Pflueger ............ 310/263
6,917,142 B2 * 7/2005 Koyama et al. ............ 310/344
7,095,161 B2 * 8/2006 Unno et al. ............ 310/348
7,256,659 B2 * 8/2007 Mizumura et al. ............ 331/68
2004/0070462 A1 * 4/2004 Alhayek et al. ............ 331/158
2006/0055478 A1   3/2006 Isimaru
2007/0075796 A1 * 4/2007 Mizumura et al. ............ 331/158

* cited by examiner

*Primary Examiner*—Thomas M Dougherty
(74) *Attorney, Agent, or Firm*—Fitch, Even, Tabin & Flannery (57) ABSTRACT

A surface mount type crystal oscillator includes: a container body composed of a laminated ceramic including a plate-shaped center layer, and first and second frame layers stacked on opposite surfaces of the center layer respectively; a crystal blank hermetically sealed in a first recess formed by the first frame layer and the center layer; an IC chip accommodated in a second recess formed by the second frame layer and the center layer; and a test terminal provided on the outer side surface of the container body and used to test the crystal blank. The center layer has at least a first layer and a second layers, and the test terminal is electrically connected to a crystal retaining terminal provided on the bottom surface of the first recess in order to retain the crystal blank through a conductive path provided on an interface between the first and second layers.

12 Claims, 8 Drawing Sheets

SURFACE MOUNT TYPE CRYSTAL OSCILLATOR

BACKGROUND OF THE INVENTION

1. Field of the Invention

The present invention relates to a quartz crystal oscillator in which at least a quartz crystal unit and an oscillation circuit using the quartz crystal unit are accommodated in a surface mount type container, and more particularly, to a crystal oscillator that uses a container body with a recess on each of its opposite principal surfaces such that the container has H-shaped cross section and that has a terminal used for test and/or adjustment on the outer side surface of the container body.

2. Description of the Related Art

A surface mount type crystal oscillator is characteristically small and lightweight, and a surface mount type temperature compensated crystal oscillator, among others, that incorporates a temperature compensation mechanism for compensating the frequency-temperature characteristics of the crystal unit has characteristically a good frequency stability against temperature changes. The surface mount type crystal oscillator, therefore, is widely used as a reference source of frequency and time, particularly in portable electronics devices, including a mobile telephone. In recent years, as the portable electronics devices are reduced in their size, there has been a need for a smaller surface mount type crystal oscillator.

Figure 1A:
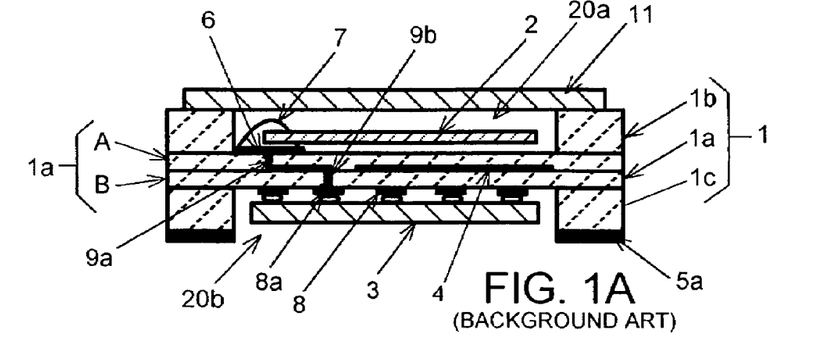
FIG. 1A is a sectional view showing an exemplary configuration of a conventional surface mount type temperature compensated crystal oscillator.

FIG. 1A is a sectional view showing an exemplary configuration of a conventional surface mount type temperature compensated crystal oscillator. The crystal oscillator is shown composed of container body 1, quartz crystal blank 2, and IC (integrated circuit) chip 3. When container body 1 is mounted on a wiring board, it appears as oblong box with long sides and short sides when viewed from above, assuming an appearance of flat and a generally rectangular shape. Each of the top and lower surfaces is provided with a recess, resulting in H-shaped cross section. Such container body 1 consists of a laminated ceramic including generally rectangular and planar center layer 1a, and upper and lower frame layers 1b, 1c each having an opening. Each of frame layers 1b, 1c is formed in a frame shape which has wall portions corresponding to the respective sides of center layer 1a and the opening surrounded by the wall portions. Center layer 1a and frame layer 1b form first recess 20a shown in the upper part of the view, and as described below, crystal blank 2 that functions as a crystal unit is accommodated in first recess 20a. Similarly, center layer 1a and frame layer 1c form second recess 20b shown in the lower part of the view, and IC chip 3 incorporating an oscillation circuit and a temperature compensation mechanism is accommodated in second recess 20b. In the figure, although any of center layer 1a and frame layers 1b, 1c is shown composed of a single layer for convenience, any of center layer 1a, and frame layers 1b, 1c is actually composed of a plurality of ceramic layers. In particular, center layer 1a is composed of first layer A as shown in the upper part and second layer B as shown in the lower part, and shield electrode layer 4 made of a metal film is provided on an interface between layers A, B.

Although the crystal oscillator described herein is a so called two-chamber type, which contains the crystal blank and the IC chip in respective recesses or chambers which are separately provided, there is alternatively a one-chamber type crystal oscillator in which both the crystal blank and the IC chip are accommodated within the same space of the container body. In general, an assembly in which a crystal blank is contained in a container referred to as a crystal unit.

Crystal blank 2 is, for example, composed of an AT-cut quartz crystal blank having a generally rectangular shape, and has an excitation electrode on each of its opposite principal surfaces. An extension electrode is extended from each of the pair of excitation electrodes toward opposite sides of an end of crystal blank 2. A pair of crystal retaining terminals 6 is provided on the bottom surface of first recess 20a, or the top surface of center layer 1a. Crystal blank 2 is fixed and retained in first recess 20a at a location where the pair of extension electrodes is drawn, by adhering each of these extension electrodes to crystal retaining terminal 6 with, for example, conductive adhesive 7.

After crystal blank 2 is fixed, metal cover 11 is joined, at the opening face of first recess 20a of container body 1, onto a metal ring (not shown) provided on the top surface of frame layer 1b by, for example, seam welding, so that crystal blank 2 is hermetically sealed within first recess 20a.

Figure 1B:
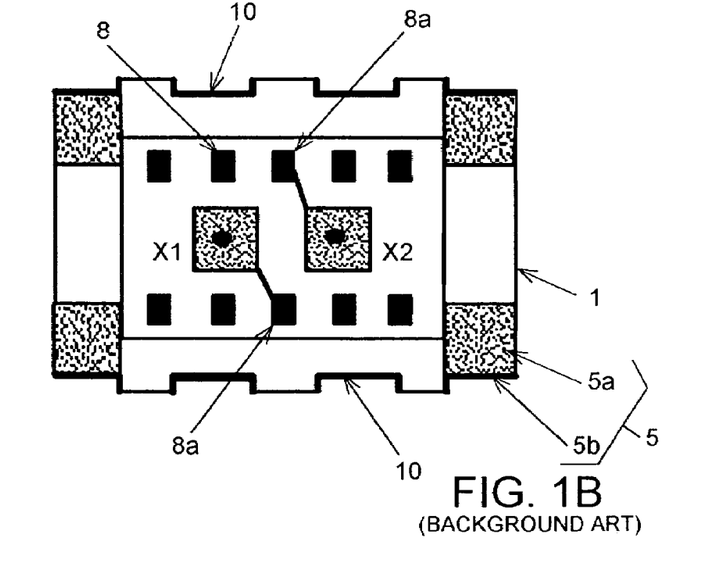
FIG. 1B is a bottom view of the crystal oscillator shown in FIG. 1A, which is not mounted with IC chip 3.
Figure 1C:
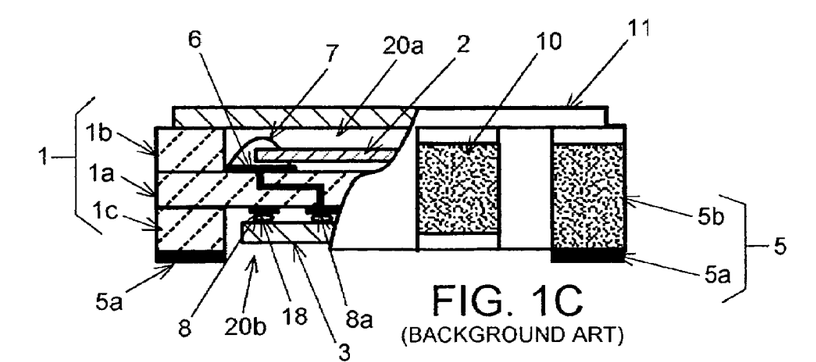
FIG. 1C is a partial sectional front view of the crystal oscillator shown in FIG. 1A.

FIG. 1B is a bottom view of the crystal oscillator shown in FIG. 1A, which is not mounted with IC chip 3, and FIG. 1C is a partial sectional front view of the crystal oscillator shown in FIG. 1A, partially showing the outer side surface of container body 1.

The side surface of container body 1 is provided with four write terminals 10 for writing temperature compensation data to the temperature compensation mechanism. Write terminals 10 are arranged such that two terminals are provided on each long side of generally rectangular center layer 1a.

In container body 1, mounting terminal 5, which is used to surface-mount the crystal oscillator on a wiring board, is formed at each of four corners of frame layers 1c that form second recess 20b. There are provided four mounting terminals 5; a power terminal, a ground terminal, an output terminal on which oscillation output appears, and an AFC (automatic frequency control) terminal to which an AFC signal is supplied. Each mounting terminal 5 is composed of bottom electrode 5a formed on the top surface of frame layer 1c, or a face that would contact with a wiring board, and side surface electrode 5b provided by a portion of bottom electrode 5a extending over the outer side surface of container body 1. At this time, each of side surface electrode 5b is formed on opposite ends of each side surface including each of the long sides of container body 1, among four side surfaces of container body 1.

A method of forming such side surface electrode 5b and write terminal 10 will now be described. To form a surface mount type container body made of a laminated ceramic, ceramic sheets each having a size corresponding to multiple container bodies are typically used, stacked, baked, and then divided into an individual container body. Each ceramic sheet corresponds to a ceramic layer described above. In this case, ceramic sheets for the layers having a size corresponding to multiple container bodies 1 are also used. Side surface electrode 5b and write terminal 10 are formed by so called through-hole processing when container body 1 is formed with the laminated ceramic, after electrode patterns made of tungsten (W) or the like are printed on ceramic sheets for the layers and the ceramic sheets for the layers are integrated. At this time, side surface electrode 5b is formed to be located on an end surface of each of ceramic layers except the outermost ceramic layer on a first recess 20a side, that is, the topmost ceramic layer, in order to prevent side surface electrode 5b from electrically short circuiting with metal cover 11. Write terminal 10 is formed to be located on an end surface of each ceramic layer except respective outermost ceramic layers on the top and bottom sides of the laminate, thereby preventing write terminal 10 from electrically short circuiting with metal cover 11 or a wiring board. When through-hole processing is provided, even a ceramic layer to be void of any side surface, electrode 5b or write terminal 10 is also provided with a hole penetrating the layer to form a through-hole surface. The ceramic sheets are stacked on top of another while 5 providing such through-hole processing as described above. Subsequently, the laminate is baked, subjected to, for example, gold plating on electrode patterns, and then divided into an individual container body 1. In this way, container body 1 with side surface electrode 5b and write terminal 10 is formed.

As shown in FIG. 1B, a plurality of circuit terminals 8 are arranged on the bottom surface of second recess 20b, or the back surface of center layer 1a, of container body 1 along both long sides of center layer 1a. Circuit terminals 8 are provided corresponding to IC terminals provided on IC chip 3 as described below. In this figure, respective five circuit terminals 8 for each long side are arranged in line. Four of these circuit terminals 8 are power, ground, output and AFC terminals corresponding to mounting terminals 5 described above, respectively, and electrically connected to corresponding mounting terminals 5 through conductive paths formed in center layer 1a. The remaining two of circuit terminals 8 are crystal circuit terminals 8a electrically connecting with crystal blank 2. Crystal circuit terminal 8a is connected to crystal retaining terminal 6 provided on the bottom surface of first recess 20a through crank-shaped via-holes 9a, 9b or the like provided in center layer 1a of container body 1. The remaining four circuit terminals except circuit terminals 8 corresponding to mounting terminals 5 and crystal circuit terminals 8a are write circuit terminals, and each of the write circuit terminals is electrically connected to write terminal 10. In addition, a pair of crystal test terminals X1, X2 is provided on the back surface of center layer 1a. Crystal test terminals X1, X2 are electrically connected to crystal circuit terminals 8a through linear conductive paths provided on the back surface of center layer 1a. Accordingly, crystal test terminals X1, X2 are electrically connected to crystal blank 2.

IC chip 3 is generally rectangular. In IC chip 3, an oscillation circuit using crystal blank 2, and a temperature compensation mechanism for compensating the frequency-temperature characteristics of crystal blank 2 are integrated on a semiconductor substrate. The oscillation circuit and temperature compensation mechanism are formed on one principal surface of the semiconductor substrate by typical semiconductor device fabrication processes. Of opposite principal surfaces of IC chip 3, then, the one on which the oscillation circuit and temperature compensation mechanism are formed on the semiconductor substrate will be referred to as a circuit-forming surface. A plurality of IC terminals 7 are arranged on the circuit-forming surface along both long sides thereof. The IC terminals corresponds to circuit terminals 8, 8a on center layer 1a of container body 1, respectively. The IC terminals are used for electrical connection of a circuit in IC chip 3. These IC terminals include terminals connected to crystal circuit terminals 8a for electrically connecting crystal blank 2 to the oscillation circuit, a power terminal, an output terminal, a ground terminal, an AFC terminal, and terminals for writing temperature compensation data. As such an IC chip, for example, type AN28518 available from Matsushita Electric Industrial Co., Ltd. may be used. IC chip 3 is secured to the bottom surface of second recess 20b by using so called flip-chip bonding technique to bond the IC terminals to circuit terminals 8, 8a provided on the bottom surface of second recess 20b by ultrasonic welding using bumps 18. Incidentally, shield electrode layer 4 embedded in center layer 1a is for electrically shielding the excitation electrodes of crystal blank 2 from IC chip 3.

To fabricate such a surface mount type temperature compensated crystal oscillator, crystal blank 2 is first accommodated and hermetically sealed in first recess 20a to constitute a crystal unit, and thereafter, vibration characteristics, such as crystal impedance (CI), or temperature characteristics of crystal blank 2 5 as a crystal unit is measured using a pair of crystal test terminals X1, X2 provided on the bottom surface of second recess 20b, or the back side of center layer 1a. Specifically, a probe is brought into contact with crystal test terminals X1, X2 to measure the vibration characteristics or temperature characteristics. If any vibration characteristics or temperature characteristics is found to be abnormal, the unit will be discarded as a defective. With an accepted unit, IC chip 3 is mounted to the bottom surface of second recess 20b and temperature compensation data is written into IC chip 3 from write terminals 10 provided on the outer side surface of container body 1. A probe is brought into contact with side surface electrodes 5b in mounting terminals 5 to check the oscillation characteristics of the crystal oscillator. Finally, although not shown herein, resin is injected in second recess 20b as an "underfill" to protect the circuit-forming surface of IC chip 3, and the temperature compensated crystal oscillator is thus completed. Incidentally, because each of side surface electrodes 5b and write terminals 10 is formed on a through-hole surface running through in the vertical direction of container body 1, there is no protrusion that causes an obstruction when a probe is brought into contact: this facilitates the contact of the probe.

In a surface mount device (SMD), because the presence of a solder fillet can be referenced to accurately check whether or not soldering is acceptable, a side surface electrode is typically provided in addition to a bottom electrode in a mounting terminal, and the crystal oscillator described above uses a side surface electrode as a measurement terminal for the oscillation characteristics. This is because a mounting terminal thus formed allows a probe to contact with both the bottom and side surfaces in consideration of a jig and the like, facilitating measurements. In addition, side surface electrode 5b can be used to check the oscillation characteristics of the crystal oscillator even after mounted on a wiring board.

Although the temperature compensated crystal oscillator described above includes four write terminals 10 for writing temperature compensation data, the number of write terminals is not limited to this, and only two write terminals may be provided on an outer side surface of container body 1, depending on a circuit design of the temperature compensation mechanism.

However, in the temperature compensated crystal oscillator described above, crystal test terminals X1, X2 provided on the bottom surface of second recess 20b of container body 1 will be covered by IC chip 3 after IC chip 3 is fixed to second recess 20b, as well as covered by resin for an underfill. As a result, after completed as a product, the crystal unit could not solely be measured for the vibration characteristics. In this case, even if there is any failure such as an oscillation failure in the temperature compensated crystal oscillator after shipment, it would be difficult to ascertain the cause of the oscillation failure due to the inability of the crystal unit to be solely checked to analyze the vibration characteristics.

In addition, when the size of a temperature compensated crystal oscillator is further reduced, for example, to or below a geometry of 3.2×2.5 mm, the bottom dimensions of the recess of container body 1 is reduced accordingly. This will make it difficult to form crystal test terminals X1, X2 having a sufficient size on the bottom surface of second recess 20b. For example, in consideration of a probe on an instrument for measuring the oscillation characteristics, each of crystal test terminals X1, X2 require to be 0.6×0.6 mm or larger. However, further reduction in size of the temperature compensated crystal oscillator will reduce the size of the crystal test terminals to or below this size, making it difficult to reliably measure the vibration characteristics. In addition, because crystal test terminals X1, X2 are disposed between rows of circuit terminals 8, there is a problem that the miniaturization of IC chip 3 itself could not be addressed.

Figure 2:
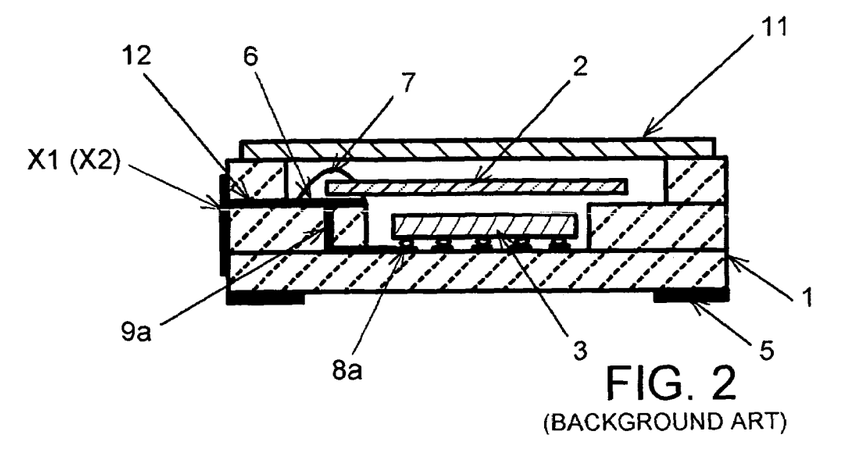
FIG. 2 is a sectional view showing an exemplary configuration of a conventional surface mount type temperature compensated crystal oscillator of a one-chamber type.

Accordingly; it is conceivable that in a two-chamber type temperature compensated crystal oscillator as described above, crystal test terminals are arranged on the outer side surface of the container body, similar to a one-chamber type temperature compensated crystal oscillator (for example, see US 2006/0055478 A1). FIG. 2 shows an exemplary configuration of a one-chamber type temperature compensated crystal oscillator. In this crystal oscillator, a single recess is formed in container body 1 and a step is formed in the recess. IC chip 3 is fixed to the bottom surface of the recess, and crystal blank 2 is fix to a pair of crystal retaining terminals 6 provided on the top surface of the step with conductive adhesive 7. Crystal test terminals X1, X2 are provided on the outer side surface of container body 1, and each of crystal test terminals X1, X2 is electrically connected to a pair of crystal retaining terminals 6 through a conductive path 12 formed an interface between ceramic layers in container body 1. In this case, crystal retaining terminal 6 is electrically connected to crystal circuit terminal 8a formed on the bottom surface of the recess through via-hole 9a formed in the step on the inner wall. The thickness of conductive path 12 is smaller than that of crystal retaining terminal 6.

Figure 3:
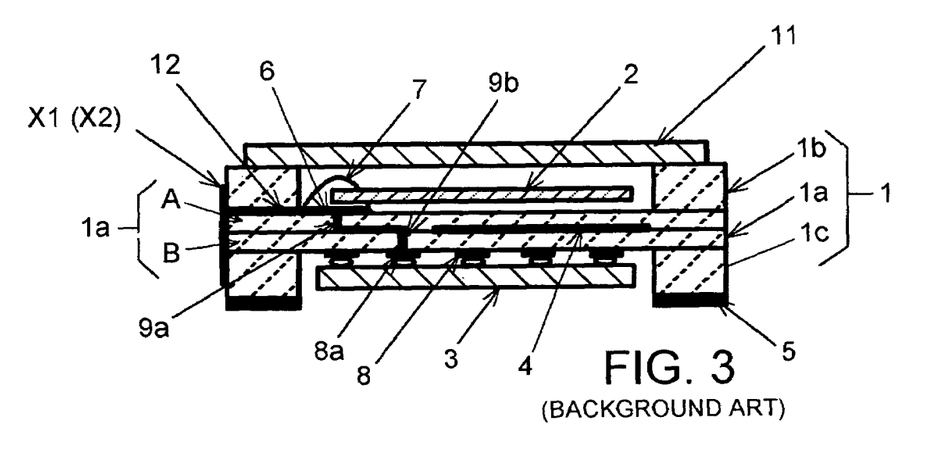
FIG. 3 is a sectional view showing an exemplary configuration of a conventional surface mount type temperature compensated crystal oscillator.

If the configuration as shown in FIG. 2 that has crystal test terminals arranged on the outer side surface of the container body was simply applied to a two-chamber type crystal oscillator as shown in FIGS. 1A to 1C, crystal retaining terminals 6 would be electrically connected to crystal test terminals X1, X2 on the outer side surface of container body 1 through a conductive path 12 formed on an interface between center layer 1a and frame layer 1b located above, as shown in FIG. 3. However, as the size of a crystal oscillator is reduced, the width of the frame potion of frame layer 1b of container body 1 needs to be reduced accordingly, thereby resulting in a reduced through-path of conductive path 12 on the interface. Consequently, when an impact is applied, cracks may occur on container body 1 near conductive path 12 and cause failure of air tightness that would be a crucial defect for a crystal unit. This is due to the fact that, in a laminated ceramic, the interface shows a higher bonding strength without a conductive path, or an electrode film. The width of a frame portion refers to a distance between the surface toward the recess side and the outside surface of the frame layer, in the direction from the recess of the container body to the outer side surface.

Figure 4A:
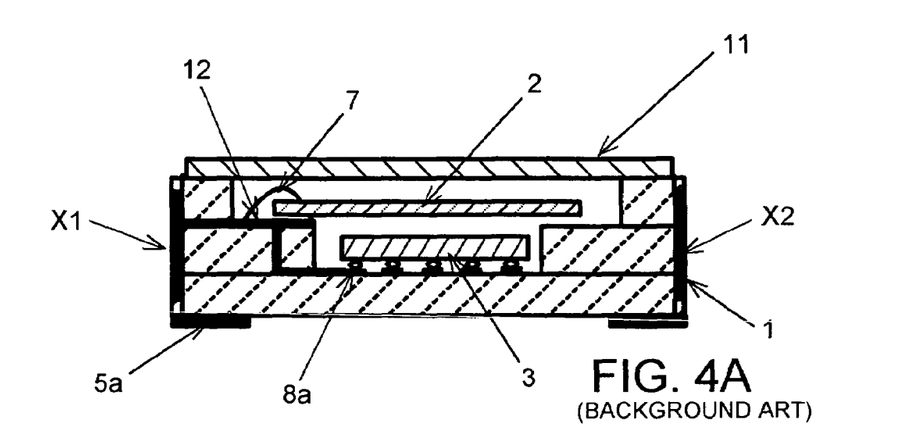
FIGS. 4A and 4B are a sectional view and a bottom view, respectively, of another example of a surface mount type temperature compensated crystal oscillator.
Figure 4B:
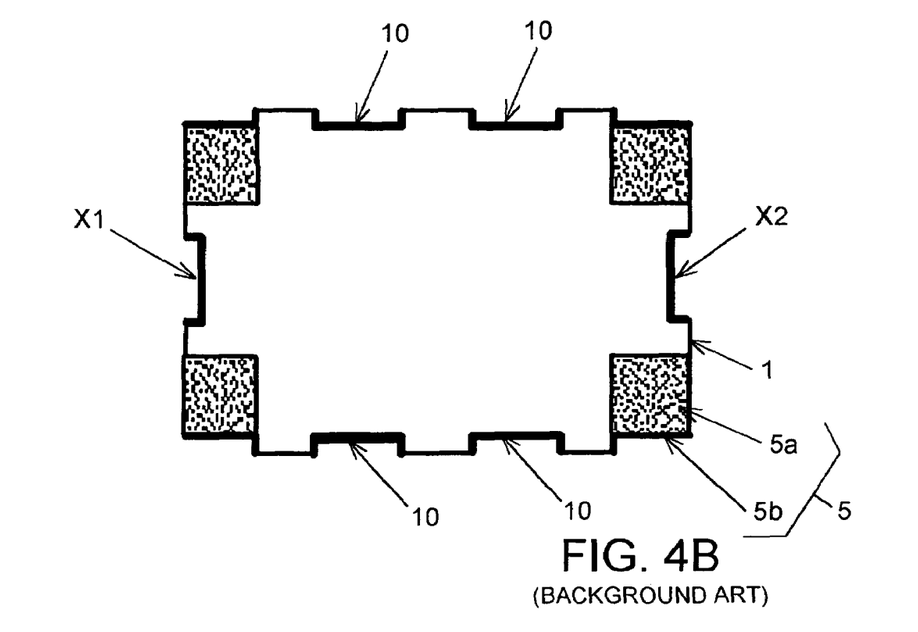

In addition, in the configuration shown in FIG. 2, it must be necessary to consider how crystal test terminals are arranged when they are provided on the outer side surface of container body 1. If there are two write terminals 10 that have been provided on the outer side surface of container body 1, constraints would be less on the arrangement of the crystal test terminals. However, if there are four write terminals 10, that is, if two write terminals 10 are provided on each side surface including the long side of container body 1, any crystal test terminal can no longer be provided on the side surface. In this case, two side surfaces including the short sides of the container body among the side surfaces of container body 1 are taken to provide one crystal test terminal on each side surface. FIGS. 4A and 4B show a temperature compensated crystal oscillator having thus arranged crystal test terminals X1, X2. However, again in this case, it is necessary to increase the width of the outer wall portion of the container body to ensure the strength of the container body, and because a step must be provided in the recess, it is difficult to reduce the outside dimensions of the container body. In the configuration shown in FIGS. 4A and 4B, even when crystal test terminals X1, X2 are provided on the short side of the container body, two crystal test terminals X1, X2, four write terminals 10, and four end surface electrodes 9b, or a total of 10 electrodes or terminals, need to be provided on the outer side surface of container body 1: this may prevent a crystal oscillator from being further reduced in size to, for example, an outer geometry of 2.0×1.6 mm.

SUMMARY OF THE INVENTION

It is an object of the invention to provide a surface mount type crystal oscillator of a two-chamber type having, on the outer side surface, an electrode used for test of a crystal unit or a terminal used to write temperature compensation data, which reliably hermetic seals the crystal unit and addresses the miniaturization.

According to a first aspect of the invention, a surface mount type crystal oscillator includes: a container body composed of a laminated ceramic including a planar center layer, first frame layer, and second frame layer, the first and second frame layers each having an opening and stacked on opposite surfaces of the center layer respectively; a pair of crystal retaining terminals provided on a bottom surface of a first recess formed by the center layer and the first frame layer; a crystal blank fixed to the crystal retaining terminals and hermetically sealed in the first recess to constitute a crystal unit; a circuit terminal provided on a bottom surface of a second recess formed by the center layer and the second frame layer; an IC chip into which an oscillation circuit using the crystal unit is integrated, the IC chip including an IC terminal corresponding to the circuit terminal, the IC chip fixed to the bottom of the second recess by the IC terminal bonded to the circuit terminal; and a test terminal provided on an outer side surface of the container body and used to test the crystal unit, wherein the circuit terminal includes a crystal circuit terminal, the center layer has at least a first layer and a second layer, the crystal retaining terminal is electrically connected to the crystal circuit terminal through first via-hole provided in the first layer and second via-hole provided in the second layer, and the crystal retaining terminal is electrically connected to the test terminal through the first via-hole and a conductive path provided on an interface between the first layer and the second layer.

According to such configuration, a through-path of the conductive path for connecting the test terminal to the crystal retaining terminal can be extended without a constraint of the width of the frame portion of the frame layer, and failure of air tightness can be prevented, for example when an impact is applied, to ensure that the first recess is hermetically sealed. In addition, the first via-hole is commonly used to electrically connect the crystal retaining terminal to the test terminal and the crystal circuit terminal on the bottom surface of the second recess, so that the need of forming another via-hole is eliminated and the design is facilitated.

According to a second aspect of the invention, a surface mount type temperature compensated crystal oscillator includes: a container body consisting of a laminated ceramic, the container body having a generally rectangular outer shape and having a first recess on a top surface and a second recess on a bottom surface; a crystal blank hermetically sealed in the first recess to constitute a crystal unit; an IC chip accommodated in the second recess, the IC chip into which an oscillation circuit using the crystal unit and a temperature compensation mechanism for compensating frequency-temperature characteristics of the crystal unit are integrated; a mounting terminal provided at each of four corners of the container body for use in mounting the crystal oscillator onto a wiring board; a pair of test terminals used to test the crystal unit, the test terminals provided on an outer side surface of the container body and electrically connected to the crystal blank; and two write terminals electrically connected to the IC chip and used to write temperature compensation data to the temperature compensation mechanism, the write terminals provided on the outer side surface of the container blank.

With such configuration, there are two write terminals, so that a pair of test terminals can be formed on the outer side surface of the container body instead of the bottom surface of the second recess, enabling to fully address the miniaturization of the crystal oscillator. In this temperature compensated crystal oscillator, the test terminal is exposed on the outer side surface of the container body, so that the vibration characteristics of the crystal unit can be analyzed even after the crystal oscillator is delivered as a product.

In the crystal oscillator according to the second aspect, the write terminals and test terminals may be formed on respective through-hole surfaces continuously formed from the lower end to the upper end of the container body such that the terminal is arranged in a middle region in a thickness direction except topmost and bottommost layers of the laminated ceramic. This configuration facilitates connection of a writing or measuring probe with the write terminal or test terminal. In addition, some arrangements of the write terminal and test terminal are conceivable. For example, providing the write terminals and the test terminals, or a total of 4 terminals, on side surfaces corresponding to the long sides of the container body, two on each side surface, eliminates the need of forming a through-hole surface for forming a surface terminal or test terminal on respective surfaces along the short sides, so that the inner volume can be increased while the width of a frame wall portion of the container body is kept small. Alternatively, the write terminals and the test terminals, or a total of 4 terminals, may be provided on four side surfaces of the container body, one on each side surface. This enables to catch up with the progress of further miniaturization of the crystal oscillator.

The mounting terminal may be constructed including a side surface electrode portion, and when the side surface electrode portion is formed on the through-hole surface, it may be formed to or beyond half the height of the container body, so as to prevent the electrode from being formed on a topmost layer of the laminated ceramic. In this way, the side surface electrode portion can be used to check whether or not soldering is acceptable with reference to the presence of a solder fillet, as well as used as a terminal for testing the oscillation characteristics. On the other hand, when the side surface electrode is formed only near a bottommost layer of the through-hole surface and the write terminal or test terminal is formed in a location above the side surface electrode, the number of locations where through-hole processing is to be provided can be reduced.

In the second aspect of the present invention, the mounting terminal may be constructed including only a bottom surface electrode portion. In this case, formation of a solder fillet is not required to be taken into consideration, and therefore, when the crystal oscillator is mounted on a wiring board, it can be mounted in a highly dense manner. In addition, the write terminal and test terminal can be provided on the middle or end portion of the side surface of the container body regardless of the distance from the side surface electrode to the write terminal and test terminal, so that the crystal oscillator can be smaller.

DETAILED DESCRIPTION OF THE PREFERRED EMBODIMENTS

Figure 5A:
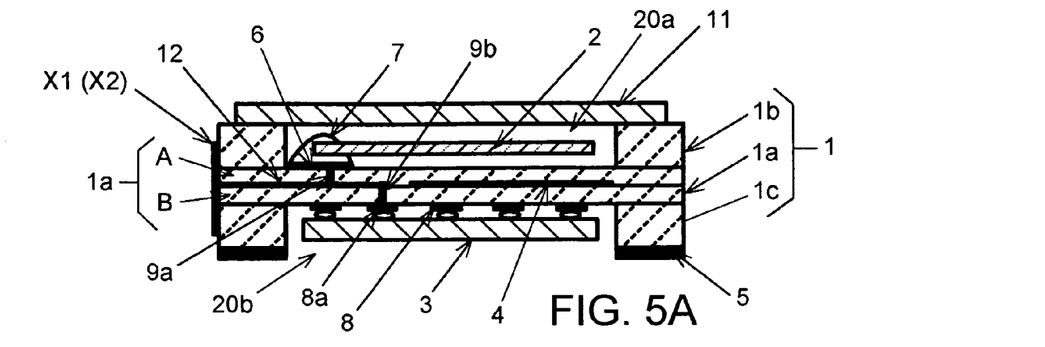
FIGS. 5A and 5B are a sectional view and a bottom view, respectively, of a surface mount type temperature compensated crystal oscillator according to a first embodiment of the present invention.
Figure 5B:
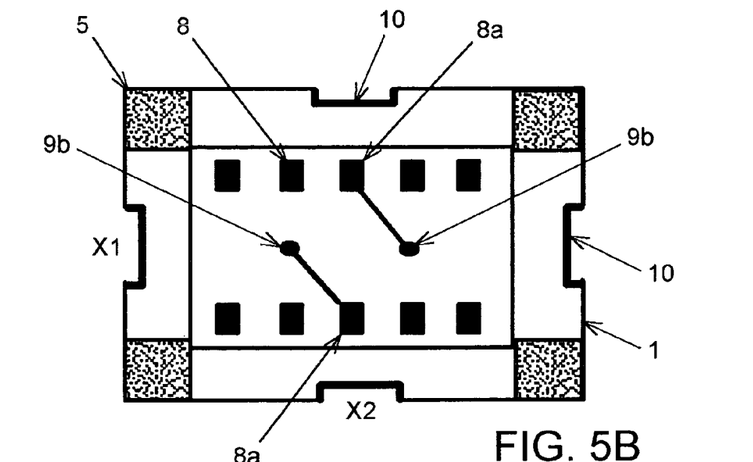

FIGS. 5A and 5B show a surface mount type quartz crystal oscillator according to a first embodiment of the present invention. In the description below, like components to those shown in FIGS. 1A, 1B, 1C, 2, 3, 4A and 4B as described above are designated by like reference characters.

A surface mount type crystal oscillator shown in FIGS. 5A and 5B is similar to the crystal oscillator shown in FIGS. 1A, 1B and 1C, and consists of container body 1 composed of a laminated ceramic including center layer 1a and frame layers 1b, 1c, quartz crystal blank 2 hermetically sealed in first recess 20a, and IC chip 3 fixed to the bottom surface of second recess 20b. Similar to that described above, center layer 1a is composed of first layer A and second layer B.

In the crystal oscillator of this embodiment, unlike the crystal oscillator shown in FIGS. 1A, 1B and 1C, a pair of crystal retaining terminals 6, which are provided on the bottom surface of first recess 20a and to which opposite sides on one end of crystal blank 2 are fixed, extends over the bottom surface of second recess 20b through a pair of first via-holes 9a provided in first layer A and a pair of second via-holes 9b provided in second layer B to directly connect with a pair of crystal circuit terminals 8a, respectively, to which IC terminals of IC chip 3 is secured. These via-holes 9a, 9b are formed in a crank-shape. Crystal test terminals X1, X2 are provided on the outer side surface of container body 1 instead of the bottom surface of second recess 20b. Crystal retaining terminals 6 are electrically connected to crystal test terminals X1, X2 from first via-holes 9a through conductive path 12 provided on an interface between first layer A and second layer B. In other words, each conductive path from crystal retaining terminal 6 is branched at an end of first via-hole 9a and electrically connected to crystal circuit terminal 8a and crystal test terminal X1 or X2.

In the crystal oscillator, there are provided two write terminals 10 that is used to write temperature compensation data, and as shown in FIG. 5B, each of a pair of crystal test terminals X1, X2 is provided on each of two adjacent side surfaces of container body 1, corresponding to one end of crystal blank 2 from which an extension electrode is extended. Write terminals 10 are provided on the two remaining side surfaces without a crystal test terminal, one on each side surface.

In this configuration, crystal retaining terminals 6 on the bottom surface of first recess 20a in which crystal blank 2 is hermetically enclosed is electrically connected to test terminals X1, X2 provided on the outer side surface of container body 1 through first via-holes 9a and conductive path 12 provided on the interface between first layer A and second layer B in center layer 1a. Therefore, the through-path of conductive path 12 can be extended without a constraint of the width of the frame portion of the frame layer, as compared to the case where test terminals X1, X2 are electrically connected to crystal retaining terminals 6 through the interface between first frame layer 1b and center layer 1a. In this way, failure of air tightness can be prevented, for example when an impact is applied, to ensure that first recess 20a is hermetically sealed. In addition, first via-holes 9a are commonly used to electrically connect crystal retaining terminals 6 to test terminals X1, X2 and crystal circuit terminals 8a on the bottom surface of second recess 20b, so that the need of forming another via-hole is eliminated and the design is facilitated.

Figure 6:
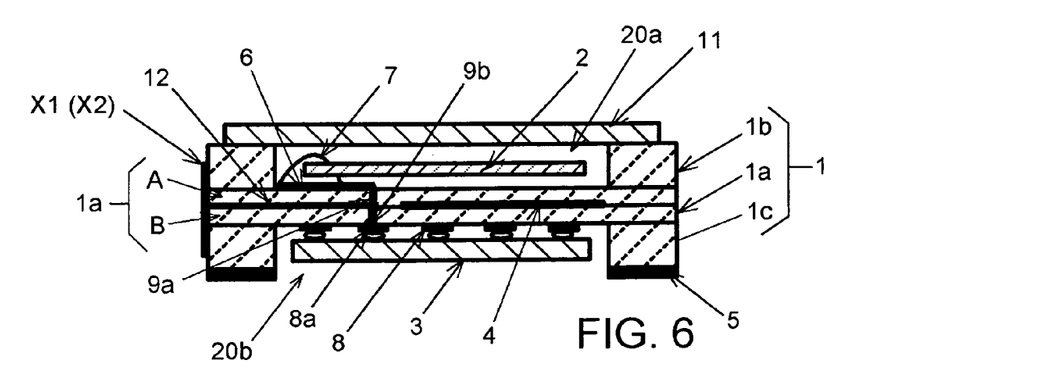
FIG. 6 is a sectional view of a surface mount type temperature compensated crystal oscillator according to a second embodiment of the present invention.

FIG. 6 shows a crystal oscillator according to a second embodiment of the present invention. In the crystal oscillator according to the first embodiment described above, first via-hole 9a is formed at a location where crystal retaining terminal 6 is formed, while in the crystal oscillator shown in FIG. 6, first via-hole 9a is formed closer to the middle of first recess 20a. In this case, because conductive path 12 formed on the interface between first layer A and second layer B allows a distance up to crystal test terminals X1, X2 to increase, hermetic seal is further ensured.

In the first and second embodiments described above, although a temperature compensated crystal oscillator having write terminals 10 has been described by way of example, the crystal oscillator may be a simple packaged crystal oscillator, which does not provide temperature compensation, and therefore, is not provided with write terminal 10.

A surface mount type temperature compensated crystal oscillator according to a third embodiment of the present invention will now be described with reference to FIGS. 7A and 7B.

Figure 7A:
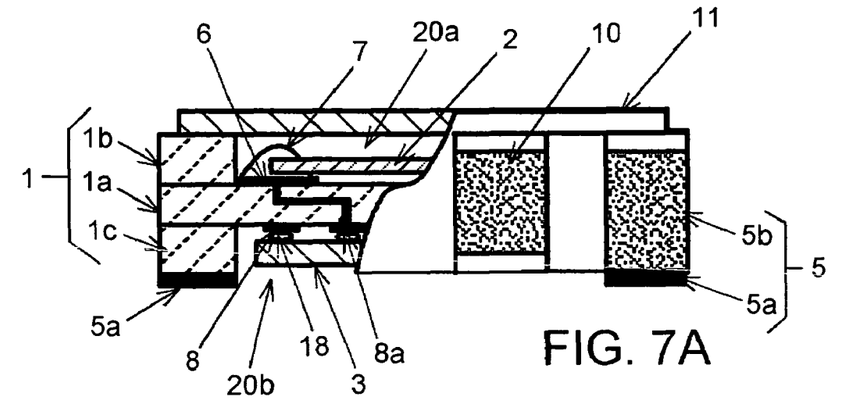
FIGS. 7A and 7B are a partial sectional front view and a bottom view, respectively, of a surface mount type temperature compensated crystal oscillator according to a third embodiment of the present invention.
Figure 7B:
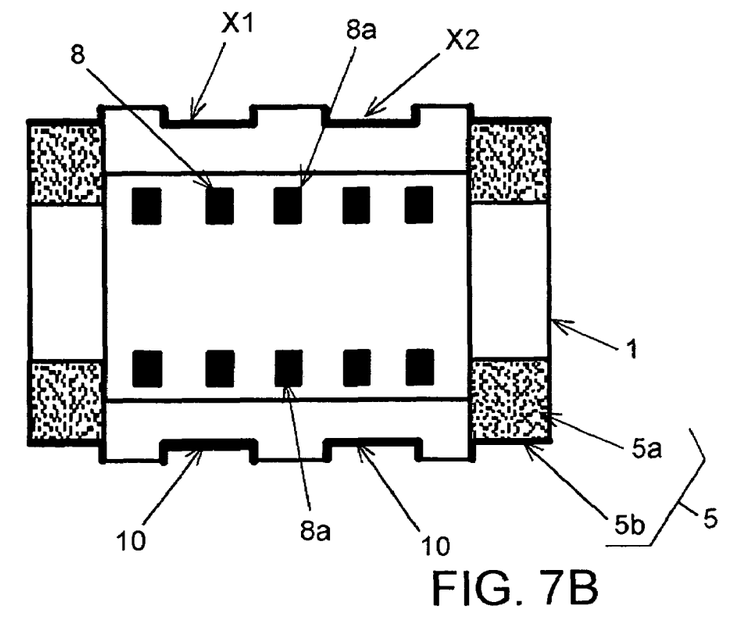

Similar to that shown in FIGS. 1A to 1C, the temperature compensated crystal oscillator shown in FIGS. 7A and 7B consists of container body 1, crystal blank 2, and IC chip 3. When container body 1 is mounted on a wiring board, it appears as oblong box with long sides and short sides when viewed from above, assuming an appearance of flat and a generally rectangular shape, and container body 1 consists of a laminated ceramic including generally rectangular and planar center layer 1a, and upper and lower frame layers 1b, 1c each having an opening. In container body 1, center layer 1a and frame layer 1b form first recess 20a shown in the upper part of the view, and center layer 1a and frame layer 1c form second recess 20b shown in the lower part of the view. In this way, container body 1 has H-shaped cross section. In the figure, although any of center layer 1a, upper frame layer 1b, or lower frame layer 1c is shown composed of a single layer for convenience, any of center layer 1a, frame layer 1b, or frame layer 1c is actually composed of multiple ceramic layers. Crystal blank 2 that functions as a crystal unit is contained in first recess 20a, and IC chip 3 incorporating an oscillation circuit and a temperature compensation mechanism is contained in second recess 20b.

In this embodiment, an IC chip having two IC terminals that are used to write temperature compensation data is used as IC chip 3, and for example, type AK2131 available from Asahi Kasei Microsystems Co., Ltd. may be used. There are provided two write terminals 10 that are electrically connected to IC chip 3 through circuit terminals 8, and these two write terminals 10 are provided between a pair of side surface electrodes 5b disposed on one side surface along the long side of container blank 1 at opposite ends of the side surface. Similarly, crystal test terminals X1, X2 electrically connected to crystal blank 2 are provided between a pair of side surface electrodes 5b on the other side surface along the long side of container body 1. Depending on the configuration of a probe used for writing data or test, one write terminal and one crystal test terminal may be provided on each side surface.

A through-hole surface continuously formed from the lower end to the upper end of the container body corresponds to each of these write terminals 10 and crystal test terminals X1, X2. On such a through-hole surface, each of write terminals 10 and crystal test terminals X1, X2 is formed in a middle region of the through-hole surface, so as to prevent an electrode pattern for the terminal from being formed on an end surface of the topmost and bottommost layers of the laminated ceramic. Incidentally, crystal retaining terminals 6 and crystal test terminals X1, X2 are electrically connected to each other by a conductive path (not shown) formed on the interface of the lamination in the laminated ceramic, and circuit terminals 8 and write terminals 10 are also connected to each other by a conductive path (not shown) formed on the interface in the laminated ceramic.

This configuration uses IC chip 3 that has two IC terminals for writing temperature compensation data, and therefore, it is only necessary to provide write terminals 10 and a pair of crystal test terminals X1, X2, or total of four terminals, except mounting terminal 5. Therefore, it is possible to dispose, for example, write terminals 10 between a pair of side surface electrodes 5b on one side surface along the long side of container body 1 and crystal test terminals X1, X2 between a pair of side surface electrodes 5b on the other side surface, leaving side electrodes 5b of mounting terminal 5. In this configuration, because crystal test terminals X1, X2 are exposed on the outer side surface of container body 1 instead of the bottom surface of second recess 20b, the crystal unit can be solely checked for the vibration characteristics even after shipment. Therefore, analysis result of a defective or the like can be obtained after shipment, leading to increased quality. In addition, because neither write terminals 10 nor crystal test terminals X1, X2 are required on side surfaces including the short side of container body 1, inner volume of the recess can be increased. Further, because mounting terminal 5 has side surface electrode 5b as with the prior art, the side surface electrode 5b may be used as a test terminal for the oscillation characteristics. Any one of write terminals 10 and crystal test terminals X1, X2 is formed in a middle region of the through-hole surface extending from an upper end to a lower end of container body 1, which facilitates the contact of the probe in writing temperature compensation data or in measuring the oscillation characteristics. Because side surface electrode 5b is provided, it is of course possible to check whether or not soldering is acceptable based on the presence of a solder fillet.

Figure 8A:
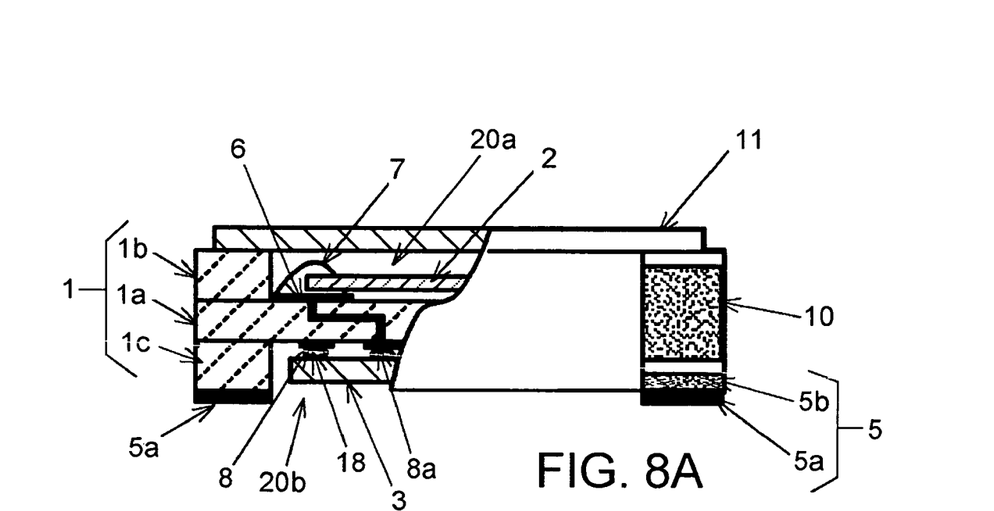
FIGS. 8A and 8B are a partial sectional front view and a bottom view, respectively, of a surface mount type temperature compensated crystal oscillator according to a fourth embodiment of the present invention.
Figure 8B:
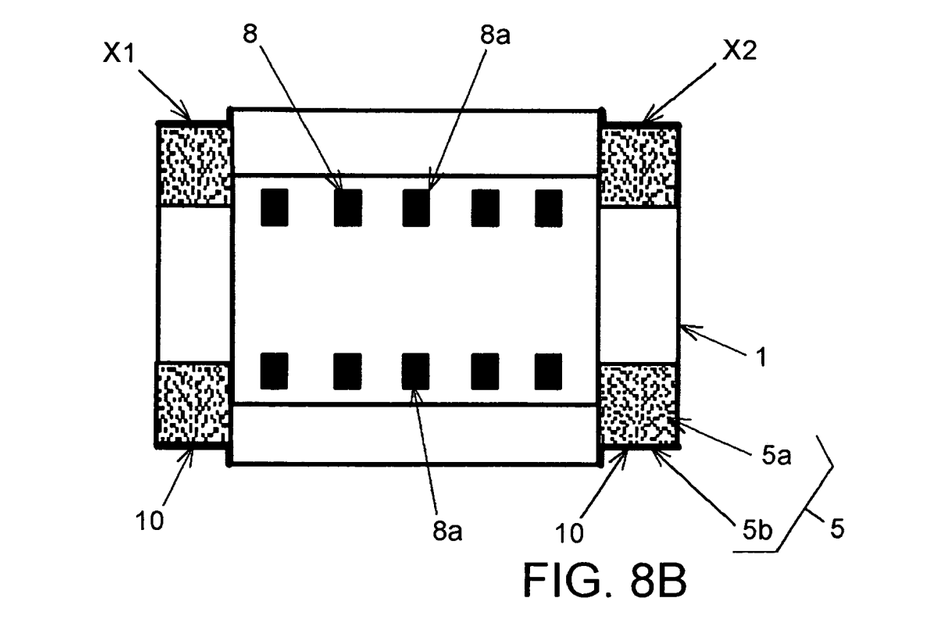

A surface mount type temperature compensated crystal oscillator according to a fourth embodiment of the present invention will now be described with reference to FIGS. 8A and 8B.

The crystal oscillator according to the fourth embodiment is similar to that of the third embodiment: it uses IC chip 3 that has two IC terminals for writing temperature compensation data, and has two write terminals 10 and two crystal test terminals X1, X2 provided on outer side surfaces of container body 1. Here, side surface electrode 5b of each mounting terminal 5 at four corners of container body 1 is formed only near the bottommost layer of the laminated ceramic. For example, side surface electrode 5b may be formed only on an end surface of the bottommost layer of the laminated ceramic. Each side surface electrode 5b is formed on a through-hole surface continuously extending from the upper end to the lower end of container body 1, and a write terminal or crystal test terminal may be formed in each of the through-hole surface above side surface electrode 5b in a height direction of container body 1, while electrically separated from side surface electrode 5b. The write terminal or crystal test terminal is formed in the through-hole surface, so as to prevent an electrode pattern from being formed on an end surface of the topmost layer of the laminated ceramic. Because there are four side surface electrodes 5b, any one of write terminal or crystal test terminal can be arranged for each side surface electrode 5b.

According to such configuration, even if length dimensions of container body 1 are reduced relative to the third embodiment, that is, if the geometry of container body 1 is reduced to, for example, 2.0×1.6 mm, write terminals 10 and crystal test terminals X1, X2 can be formed on each side surface including the long side of container body 1. Similar to the third embodiment, because crystal test terminals X1, X2 are exposed on the outer side surface of container body 1, the crystal unit can be solely checked for the vibration characteristics even after shipment. Since crystal test terminals X1, X2 do not exist on the bottom surface of second recess 20b, circuit terminal 8 can still be formed even if IC chip 3 is reduced in size such that an interval between IC terminals is reduced.

Because neither write terminals 10 nor crystal test terminals X1, X2 are required on side surfaces including short sides of container body 1, inner volume of the recess can be increased while the width of the frame portion of the frame layer is kept small.

Further, because side surface electrode 5b of mounting terminal 5 and write terminals 10 or crystal test terminals X1, X2 are formed on the same through-hole surface and separated from each other, the number of through-hole surfaces can be reduced by half relative to when through-hole surfaces are separately formed for the electrode and terminal, and the strength of container body 1 including, for example, frame walls can be increased.

Figure 9A:
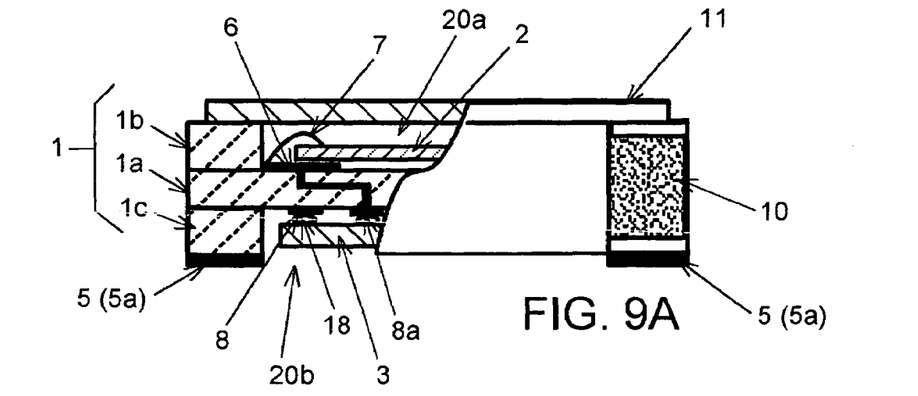
FIGS. 9A and 9B are a partial sectional front view and a bottom view, respectively, of a surface mount type temperature compensated crystal oscillator according to a fifth embodiment of the present invention.
Figure 9B:
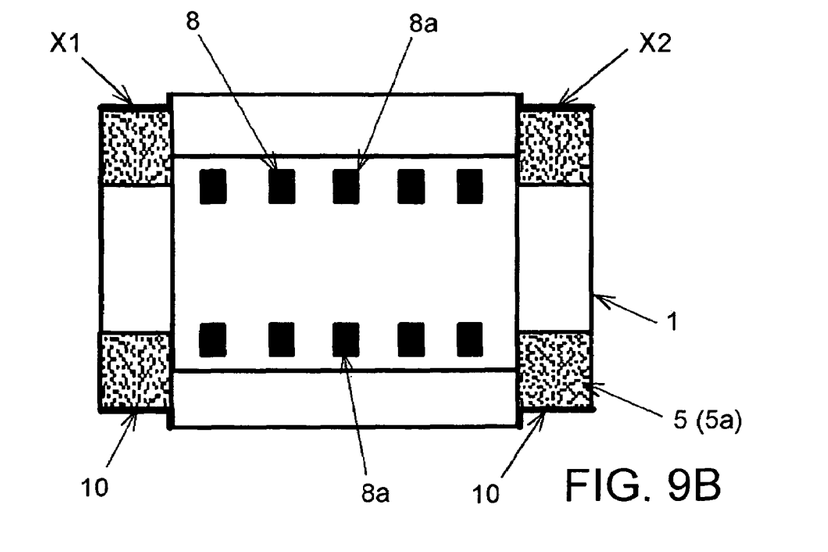

A surface mount type temperature compensated crystal oscillator according to a fifth embodiment of the present invention will now be described with reference to FIGS. 9A and 9B.

The crystal oscillator according to the fifth embodiment is similar to that of the fourth embodiment: two write terminals 10 are formed on opposite ends of one side surface including the long side of container body 1, and a pair of crystal test terminals X1, X2 is formed on opposite ends of the other side surface including the long side of container body 1. Here, no side surface electrode is provided on mounting terminal 5, and mounting terminal 5 is formed only by a bottom electrode. Therefore, no electrode pattern is formed on an end surface of the bottommost layer of the laminated ceramic. Write terminals 10 and crystal test terminals X1, X2 are electrically independent of mounting terminal 5 because no electrode pattern is formed on the bottommost layer.

In such configuration, even if length dimensions of container body 1 are reduced, write terminals 10 and crystal test terminals X1, X2 can be formed on each side surface including the long side of container body 1, similar to the fourth embodiment. The crystal unit can be solely checked for the vibration characteristics even after delivery. In addition, the width of the frame portion along the short side of container body 1 can be reduced while inner volume of the recess can be increased.

Because a side surface electrode is eliminated from mounting terminal 5, no solder fillet is formed. Consequently, molten solder cannot directly be checked when the crystal oscillator is mounted on a wiring board. Instead, a land area on the wiring board side can be reduced, so that packaging density can be increased. Incidentally, if it would not able to check whether or not soldering is acceptable with reference to the presence of a solder fillet, soldering quality can otherwise be assured by strict management of heating temperature and time during reflow soldering. If necessary, a narrow side surface electrode for forming a solder fillet may be formed on a side surface of the short side adjacent to write terminals 10 and crystal test terminals X1, X2.

Figure 10:
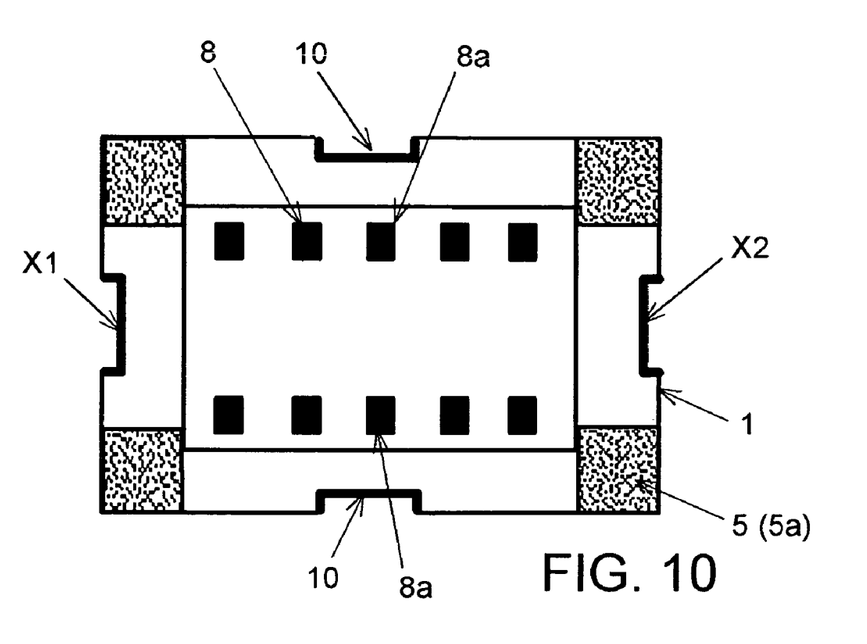
FIG. 10 is a bottom view of surface mount type temperature compensated crystal oscillator according to another embodiment of the present invention.

Although, in the third to fifth embodiments described above, write terminals 10 and crystal test terminals X1, X2 are provided on each side surface along the long side of container body 1, these terminals may be provided on four side surfaces of container body 1, one on each side surface, as shown in FIG. 10 for example. In this case, because one terminal is provided on each side surface, it is possible to address further miniaturization. Although mounting terminal 5 is constituted only by bottom electrode 5a in FIG. 10, side surface electrode 5b for forming a solder fillet may be provided. In this case, side surface electrode 5*b* may be narrow in width, or may be formed on a through-hole surface, on which side surface electrode 5*b* is formed, to extend to or beyond half the height, similar to the third embodiment.

What is claimed is:

1. A surface mount type crystal oscillator, comprising:
   a container body composed of a laminated ceramic including a planar center layer, first frame layer, and second frame layer, the first and second frame layers each having an opening and stacked on opposite surfaces of the center layer respectively;
   a pair of crystal retaining terminals provided on a bottom surface of a first recess formed by the center layer and the first frame layer;
   a crystal blank fixed to the crystal retaining terminals and hermetically sealed in the first recess to constitute a crystal unit;
   a circuit terminal provided on a bottom surface of a second recess formed by the center layer and the second frame layer;
   an IC chip into which an oscillation circuit using the crystal unit is integrated, the IC chip including an IC terminal corresponding to the circuit terminal, the IC chip fixed to the bottom of the second recess by the IC terminal bonded to the circuit terminal; and
   a test terminal provided on an outer side surface of the container body and used to test the crystal unit,
   wherein the circuit terminal includes a crystal circuit terminal,
   the center layer has at least a first layer and a second layer, the crystal retaining terminal is electrically connected to the crystal circuit terminal through first via-hole provided in the first layer and second via-hole provided in the second layer, and
   the crystal retaining terminal is electrically connected to the test terminal through the first via-hole and a conductive path provided on an interface between the first layer and the second layer.

2. The crystal oscillator according to claim 1, wherein a mounting terminal for use in mounting the crystal oscillator onto a wiring board is provided on each surface at four corners of the second frame layer, and the mounting terminal is electrically connected to at least a part of the circuit terminal.

3. The crystal oscillator according to claim 2, wherein a temperature compensation mechanism for compensating frequency-temperature characteristics of the crystal unit is integrated into the IC chip, and a write terminal used to write temperature compensation data to the temperature compensation mechanism and electrically connected to the circuit terminal is provided on the outer side surface of the container body.

4. A surface mount type temperature compensated crystal oscillator, comprising:
   a container body consisting of a laminated ceramic, the container body having a generally rectangular outer shape and having a first recess on a top surface and a second recess on a bottom surface;
   a crystal blank hermetically sealed in the first recess to constitute a crystal unit;
   an IC chip accommodated in the second recess, the IC chip into which an oscillation circuit using the crystal unit and a temperature compensation mechanism for compensating frequency-temperature characteristics of the crystal unit are integrated;
   a mounting terminal provided at each of four corners of the container body for use in mounting the crystal oscillator onto a wiring board;
   a pair of test terminals used to test the crystal unit, the test terminals provided on an outer side surface of the container body and electrically connected to the crystal blank; and
   two write terminals electrically connected to the IC chip and used to write temperature compensation data to the temperature compensation mechanism, the write terminals provided on the outer side surface of the container body.

5. The crystal oscillator according to claim 4, wherein each of the write terminals and test terminals is formed in a middle region in a thickness direction except topmost and bottommost layers of the laminated ceramic on a through-hole surface continuously formed from a lower end to an upper end of the container body.

6. The crystal oscillator according to claim 5, wherein the container body has a generally rectangular outer shape with long sides and short sides, and the write terminals and the test terminals, or a total of 4 terminals, are provided on side surfaces corresponding to the long sides of the container body, two on each side surface.

7. The crystal oscillator according to claim 5, wherein the write terminals and the test terminals, or a total of 4 terminals, are provided on four side surfaces of the container body, one on each side surface.

8. The crystal oscillator according to claim 4, wherein the mounting terminal includes a bottom electrode and an side surface electrode, the bottom electrode formed in a location where corresponds to an outer bottom surface of the container body and the side surface electrode being a portion extended from the bottom electrode over the outer side surface of the container body, and
   wherein the side surface electrode is formed to or beyond half the height of the container body on a through-hole surface continuously formed from a lower end to an upper end of the container body, so as to prevent the electrode from being formed on a topmost layer of the laminated ceramic.

9. The crystal oscillator according to claim 8, wherein the container body has a generally rectangular outer shape with long sides and short sides, and the side surface electrode is formed on opposite ends in a longitudinal direction of the container body, on each of side surfaces corresponding to the long sides of the container body.

10. The crystal oscillator according to claim 4, wherein the container body has a generally rectangular outer shape with long sides and short sides,
    wherein the mounting terminal includes a bottom electrode and a side surface electrode, the bottom electrode formed in a location where corresponds to an outer bottom surface of the container body and the side surface electrode being a portion extended from the bottom electrode over the outer side surface of the container body, on each of side surfaces corresponding to the long sides of the container body,
    wherein the side surface electrode is formed near a bottommost layer of the laminated ceramic on a through-hole surface continuously formed from a lower end to an upper end of the container body, and
    wherein the write terminal or the test terminal is formed above the side surface electrode on the through-hole surface in a height direction of the container body, so that the terminal is electrically separated from the side surface electrode.

11. The crystal oscillator according to claim 4, wherein the mounting terminal is formed only on the outer bottom surface of the container body, and each of the write terminals and test terminals is formed in a middle region in a height direction of the container body except topmost and bottommost layers of the laminated ceramic on a through-hole surface continuously formed from a lower end to an upper end of the container body, said through-hole surface provided on outer side surface of the container body at each of the four corners.

12. The crystal oscillator according to claim 4, wherein the mounting terminal is formed only on the outer bottom surface of the container body, and each of the write terminals and test terminals is formed in a middle region in a height direction of the container body except topmost and bottommost layers of the laminated ceramic on a through-hole surface continuously formed from a lower end to an upper end of the container body, said through-hole surface provided at a middle portion of each side surface of the container body.

* * * * *